(12) United States Patent
Kaneko

(10) Patent No.: US 6,451,489 B1
(45) Date of Patent: Sep. 17, 2002

(54) PHASE SHIFT PHOTOMASK

(75) Inventor: Hideo Kaneko, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 77 days.

(21) Appl. No.: 09/666,907

(22) Filed: Sep. 20, 2000

(30) Foreign Application Priority Data

Sep. 21, 1999 (JP) .......................................... 11-266597

(51) Int. Cl.⁷ ................................................. G03F 9/00
(52) U.S. Cl. ......................................................... 430/5
(58) Field of Search ....................... 430/5, 394; 378/34, 378/35; 716/19, 21

(56) References Cited

U.S. PATENT DOCUMENTS

| | | | |
|---|---|---|---|
| 5,393,623 A | 2/1995 | Kamon | 430/5 |
| 5,474,864 A | 12/1995 | Isao et al. | 430/5 |
| 5,538,816 A | 7/1996 | Hashimoto et al. | 430/5 |
| 5,538,818 A | 7/1996 | Kamon | 430/5 |
| 5,629,114 A | 5/1997 | Isao et al. | 430/5 |
| 5,674,647 A | 10/1997 | Isao et al. | 430/5 |
| 5,691,090 A | 11/1997 | Isao et al. | 430/5 |
| 5,738,959 A | 4/1998 | Miyashita et al. | 430/5 |
| 5,830,607 A | 11/1998 | Isao et al. | 430/5 |
| 5,916,712 A | 6/1999 | Miyashita el al. | 430/5 |
| 6,159,643 A | * 12/2000 | Levinson et al. | 430/5 |

FOREIGN PATENT DOCUMENTS

| | | |
|---|---|---|
| JP | 62-59296 | 12/1987 |
| JP | 4-136854 | 5/1992 |
| JP | 6-308713 | 11/1994 |
| JP | 7-110572 | 4/1995 |
| JP | 7-140635 | 6/1995 |
| JP | 2889047 | 2/1999 |

OTHER PUBLICATIONS

English Abstract for JP–A 58–173744 (corresponds to JP–B 62–59296).

* cited by examiner

Primary Examiner—S. Rosasco
(74) Attorney, Agent, or Firm—Millen, White, Zelano & Branigan, P.C.

(57) ABSTRACT

A phase shift photomask is constructed by forming a phase shifter defining a second light transmissive region on a substrate transmissive to exposure light. Exposure light undergoes multiple reflection within the phase shifter. This enables use of a thinner shifter film, minimizes a phase variation relative to a film thickness variation, and alleviates optical restraints on the film.

20 Claims, 2 Drawing Sheets

PHASE SHIFT PHOTOMASK

This invention relates to a phase shift photomask for use in the microfabrication of high density integrated circuits such as LSI and VLSI and magnetic heads.

BACKGROUND OF THE INVENTION

Photolithography using photomasks is utilized in the microfabrication of semiconductor integrated circuit devices such as LSI and VLSI. The photomasks used are generally of the following construction. A light shielding film, typically a chromium film is formed on a transparent substrate such as quartz glass, and a chromium oxide film is formed on the chromium film for preventing light reflection, which gives a photomask blank. A predetermined pattern is defined in the light shielding film of this photomask blank.

As the degree of integration of semiconductor integrated circuit devices increases, the micropatterning size is reduced. This gives rise to several problems including narrowing of the light shielding zone due to the light diffraction effect upon exposure, distortion of the light shielding zone pattern due to the interference effect between adjacent patterns, and difficult processing of microscopic configuration. To overcome these problems, a photomask having a phase shifter utilizing the coherency of incident light was proposed (see JP-A 58-173744, JP-B 62-59296 and JP-A 7-110572). The phase shifter includes several types. With respect to transmissive masks, there are known the halftone type in which a phase difference of π is provided between the light transmitted by the shielding film and the light transmitted outside the shielding film so that the attenuation of light at the edge of the shielding film is enhanced (see JP-A 4-136854) and the Levenson type in which a phase shifter is formed on one of a pair of adjacent light transmissive zones (see JP-B 62-59296).

One exemplary reflective mask is shown in Japanese Patent No. 2,889,047 as comprising at least two reflective layers wherein a phase difference due to reflection from different heights is utilized.

These phase shift masks, however, encounter difficulty in manufacture process because precise uniformity is imposed on their film thickness and quality and a phase difference must be strictly controlled. For example, a reactive sputtering process is generally used in the manufacture of a phase shifter film. On an attempt to deposit by reactive sputtering Mo—Si—O—N which is disclosed as a phase shifter in JP-A 7-140635, there arises a problem that the thickness of an optical film becomes uneven in plane, failing to meet the uniformity required for the phase shifter.

Additionally, the optical constant of the film is restricted. Even in the case of a high refractive index film which can be used at a reduced thickness, its thickness is determined from the refractive index, and its coefficient of absorption is determined from the transmittance. The film which can be used as a phase shifter is restricted. With respect to the photomask using a phase shifter, it is known from JP-A 6-308713 that when the phase shifter consists of a single layer film, the film thickness d must satisfy the equation:

$$(n-1)d = \lambda/2$$

wherein $\lambda$ is the wavelength of incident light and n is the refractive index of the film. This indicates that light is transmitted by the phase shifter without undergoing multiple reflection.

For this reason, once a refractive index is determined, the thickness of a phase shifter film is determined. It is impossible to reduce the thickness of a phase shifter film. This results in low productivity, mask deflection, and film peeling.

SUMMARY OF THE INVENTION

An object of the invention is to provide a phase shift photomask which can reduce the thickness of a phase shifter film and minimize the variation of phase difference.

It has been found that if light undergoes multiple reflection within a phase shifter film, the phase variation relative to a variation of film thickness can be reduced, and hence, optical restrictions on the film can be alleviated.

The invention provides a phase shift photomask comprising a substrate transmissive to exposure light and a phase shifter formed thereon. The region of the substrate which is not covered by the phase shifter defines a first light transmissive region, and the phase shifter defines a second light transmissive region. According to the invention, exposure light undergoes multiple reflection within the phase shifter. Preferably the phase shifter includes at least two stacked films, and more preferably at least a reflective film and a transparent film.

The phase shifter in the photomask of the invention is to place a stationary point at a phase difference of 180 degrees utilizing multiple reflection of light. The structure that multiple reflection occurs within the phase shifter has the following benefits.

(1) At a film thickness providing a phase difference a, the dependency of phase difference on (optical) film thickness is reduced, and even the phase difference is substantially independent of the film thickness. Then the variation of phase difference is minimized even with variations of film thickness and quality, so that the film can be easily formed.

(2) Any film which is transmissive to incident light can be used. Even a film having a too low coefficient of absorption is useful. A film can be chosen in terms of film stress other than optical properties.

(3) Because of multiple reflection of light within the film, the film thickness can be reduced.

BRIEF DESCRIPTION OF THE DRAWINGS

The above and other objects, features and advantages of the invention will be better understood by reading the following description taken in conjunction with the accompanying drawings.

DESCRIPTION OF THE PREFERRED EMBODIMENT

Figure 1:
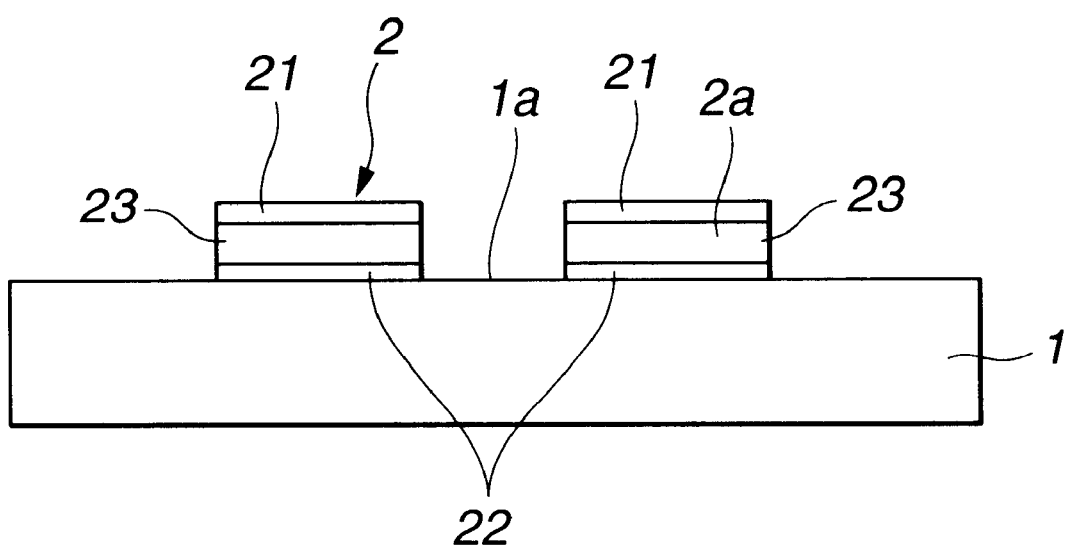
FIG. 1 is a cross-sectional view of a phase shift mask according to one embodiment of the invention.

Referring to FIG. 1, a phase shift photomask according to the invention is illustrated as comprising a substrate 1 of quartz, CaF$_2$ or similar material transmissive to exposure light and patterned sections of shifter film 2 formed thereon. First light transmissive zones 1a are defined between shifter film sections, i.e., by the transparent substrate 1 alone, while the shifter film sections define second light transmissive zones 2a. The feature of the invention is that exposure light is subject to multiple reflection within the shifters provided by the second light transmissive zones 2a.

In order to provide a multiple reflection structure, it is recommended that a transparent film of the phase shifter have a lower coefficient of absorption at the incident wavelength. Where the phase shifter is formed by a single layer film, a higher refractive index is preferable. To provide a greater multiple reflection effect, the phase shifter may be formed by two or more stacked layers or films. Two layers having largely different optical constants give a greater effect. Three or more layers may be used in order to provide a further multiple reflection effect.

In the embodiment wherein a multilayer film is used, it may consist of at least a reflective film and a transparent film. For example, a structure having a transparent film sandwiched between metal films achieves a greater effect.

This is illustrated in FIG. 1. The phase shifter 2 shown in FIG. 1 includes a pair of reflective films 21 and 22 and a transparent film 23 therebetween.

The transparent film is preferably formed of gadolinium-gallium-garnet (GGG), lithium tantalate, $SiO_2$, SiN, SiON or SiC. The reflective film is generally formed of a metal such as gold, copper or chromium.

No particular limit is imposed on the film thickness. The film thickness may be selected so as to meet the desired transmittance, phase and reflectance although a thinner film is preferable. A film thickness of up to 300 nm, and especially up to 200 nm is preferable.

The mode used in the phase shift mask is not critical. The phase shift mask may be of the halftone or Levenson type. The shifter film may be formed by any desired deposition method such as CVD and sputtering.

No particular limit is imposed on the wavelength of incident light used with the inventive photomask. For example, g- and i-lines of a mercury lamp may be used. For micropatterning, a shorter wavelength is desirable. For example, a wavelength of 248 nm produced by a KrF excimer laser or shorter is desirable, with a wavelength of 193 nm produced by a ArF excimer laser or shorter being more desirable.

The phase shift photomask of the invention is applicable to the manufacture of hard disk heads and micromachines as well as the manufacture of semiconductor integrated circuits.

EXAMPLE

Examples of the invention are given below by way of illustration and not by way of limitation.

Example 1

Figure 2:
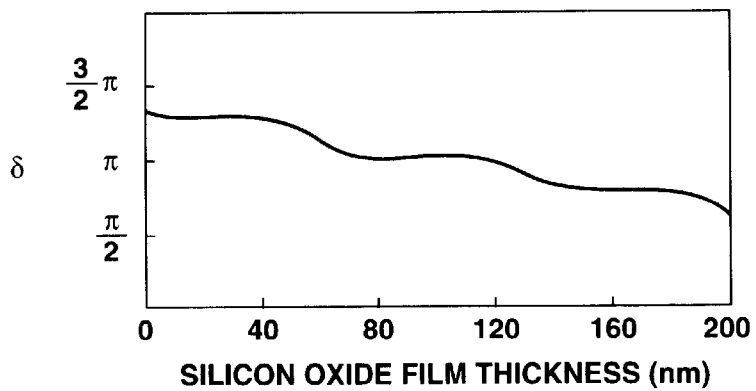
FIG. 2 is a graph showing a phase difference versus silicon oxide film thickness in Example 1.

On a quartz substrate, a chromium film of 20 nm thick was deposited as a reflective film, silicon oxide was then deposited as a transparent film, and a chromium film of 15 nm thick was further deposited thereon. While varying the thickness of silicon oxide, a phase difference was determined at the wavelength of an ArF excimer laser. The results are shown in FIG. 2. A phase difference of $\pi$ (180°) is provided at a thickness of silicon oxide close to 90 nm. It is seen that a little variation of film thickness around this value brings no substantial change of phase difference. The sum of the thicknesses of all the films providing a phase difference of $\pi$ (180°) was 145 nm, which is 40% reduced from the thickness of a single layer film in Comparative Example.

Example 2

Figure 3:
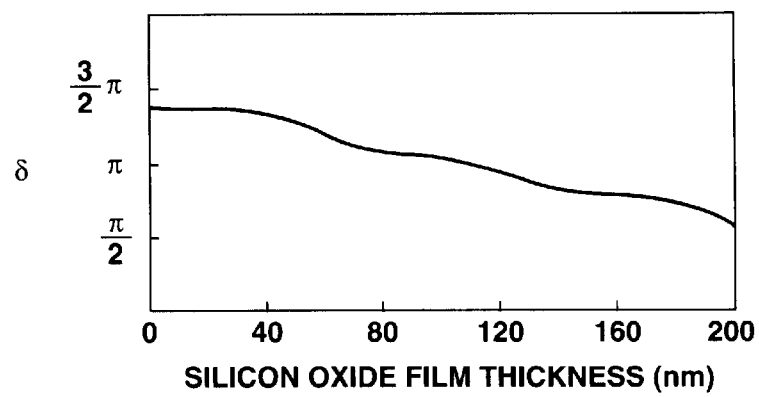
FIG. 3 is a graph showing a phase difference versus silicon oxide film thickness in Example 2.

On a quartz substrate, GGG was deposited to 30 nm, a chromium film of 15 nm thick was deposited as a reflective film, silicon oxide was then deposited as a transparent film, and a chromium film of 15 nm thick was further deposited thereon. While varying the thickness of silicon oxide, a phase difference was determined at the wavelength of an ArF excimer laser. The results are shown in FIG. 3. A phase difference of $\pi$ (180°) is provided at a thickness of silicon oxide close to 90 nm. It is seen that a little variation of film thickness around this value brings no substantial change of phase difference. The sum of the thicknesses of all the films providing a phase difference of $\pi$ (180°) was 145 nm, which is 40% reduced from the thickness of a single layer film in Comparative Example.

Comparative Example

Figure 4:
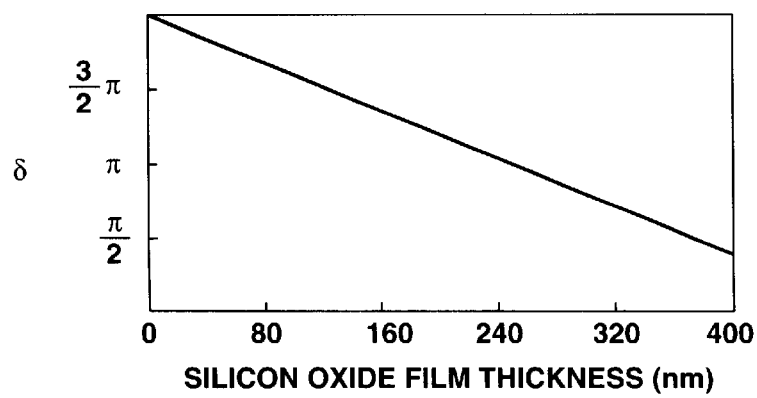
FIG. 4 is a graph showing a phase difference versus silicon oxide film thickness in Comparative Example.

A phase shifter film was formed solely of silicon oxide. While varying the thickness of silicon oxide, a phase difference was similarly determined, with the results shown in FIG. 4. It is seen that the phase shifts with the film thickness. The film thickness at which the phase difference becomes $\pi$ was 240 nm.

The invention enables to reduce the thickness of a shifter film, to minimize the phase variation with varying film thickness, and to mitigate optical restraints required for the shifter film.

Japanese Patent Application No. 11-266597 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A phase shift photomask comprising a substrate transmissive to exposure light and a phase shifter formed thereon with patterned section to define a second light transmissive region, wherein exposure light undergoes multiple reflection within said phase shifter.

2. The phase shift photomask of claim 1 wherein said phase shifter includes at least two stacked films.

3. The phase shift photomask of claim 2 wherein said phase shifter includes at least a reflective film and a transparent film.

4. A photomask according to claim 3, wherein said transparent film has a thickness sufficient to provide a phase difference of 180°.

5. A phase shift photomask of claim 3, wherein said reflective film is formed from gold, copper or chromium.

6. A photomask according to claim 5, wherein said transparent film is formed of gadolinium-gallium-garnet, lithium tantalite, $SiO_2$, SiN, SiON, or SiC.

7. A photomask according to claim 6, wherein said phase shifter has a thickness of up to 300 nm.

8. A photomask according to claim 7, wherein said phase shifter has a thickness of up to 200 nm.

9. A photomask according to claim 3, wherein said transparent film is formed of gadolinium-gallium-garnet, lithium tantalite, $SiO_2$, SiN, SiON, or SiC.

10. A photomask according to claim 2, wherein said phase shifter has a structure having a transparent film sandwiched between reflective films in the form of metal films, said transparent films having a thickness to provide a phase difference of 180°, im said phase shifter has a thickness of up to 300 nm.

11. A photomask according to claim 10, wherein said transparent film is formed of gadolinium-gallium-garnet, lithium tantalite, $SiO_2$, SiN, SiON, or SiC, and said reflective film is formed of chromium.

12. A photomask according to claim 1, wherein a stationary point is placed in the phase shifter at a phase difference of 180° whereby exposure light undergoes multiple reflection within said phase shifter.

13. A photomask according to claim 1, wherein said phase shifter has a thickness of up to 300 nm.

14. A photomask according to claim 13, wherein said phase shifter has a thickness of up to 200 nm.

15. A phase shift photomask comprising a light transmissive substrate and a patterned phase shifter on the top surface of said substrate wherein said phase shift photomask exhibits first light transmissive zones formed by regions of the substrate between sections of the phased shifter, and second life light transmissive zones formed by the sections of the phased shifter, and wherein exposure light undergoes multiple reflection within said phase shifter.

16. A phase shift photomask of claim 15, wherein said phase shifter includes at least two stacked films.

17. A phase shift photomask of claim 16, wherein said phase shifter includes at least a reflective film and a transparent film.

18. A phase shift photomask of claim 17, wherein said reflective film is formed from gold, copper or chromium.

19. A photomask according to claim 17, wherein said transparent film is formed of gadolinium-gallium-garnet, lithium tantalite, $SiO_2$, SiN, SiON, or SiC.

20. A photomask according to claim 15, wherein said phase shifter has a thickness of up to 300 nm.

* * * * *